(12) United States Patent
Egger et al.

(10) Patent No.: US 7,015,049 B2
(45) Date of Patent: Mar. 21, 2006

(54) FENCE-FREE ETCHING OF IRIDIUM BARRIER HAVING A STEEP TAPER ANGLE

(75) Inventors: Ulrich Egger, Kanagawa-ken (JP); Haoren Zhuang, Tokyo-to (JP); George Stojakovic, Munich (DE); Kazuhiro Tomioka, Kanagawa-ken (JP)

(73) Assignees: Infineon Technologies AG (DE); Kabushiki Kaisha Toshiba (JP)

( * ) Notice: Subject to any disclaimer, the term of this patent is extended or adjusted under 35 U.S.C. 154(b) by 94 days.

(21) Appl. No.: 10/654,376

(22) Filed: Sep. 3, 2003

(65) Prior Publication Data

US 2005/0045937 A1 Mar. 3, 2005

(51) Int. Cl.
H01L 21/00 (2006.01)

(52) U.S. Cl. .................... 438/3; 438/240; 438/695; 438/734

(58) Field of Classification Search ............. 438/3, 438/239, 240, 250, 393, 695, 696, 701, 702, 438/713, 734
See application file for complete search history.

(56) References Cited

U.S. PATENT DOCUMENTS

| | | | |
|---|---|---|---|
| 6,143,191 A | 11/2000 | Baum et al. | |
| 6,368,518 B1 | 4/2002 | Vaartstra | |
| 6,611,014 B1 | 8/2003 | Kanaya et al. | |
| 6,746,877 B1 * | 6/2004 | Hornik et al. | 438/3 |
| 6,762,064 B1 * | 7/2004 | Zhuang et al. | 438/3 |
| 2001/0034106 A1 | 10/2001 | Moise et al. | |
| 2002/0011463 A1 | 1/2002 | Buskirk et al. | |
| 2002/0037637 A1 | 3/2002 | Xing et al. | |
| 2002/0105016 A1 | 8/2002 | Tohda | |
| 2003/0059720 A1 | 3/2003 | Hwang et al. | |
| 2003/0068846 A1 | 4/2003 | Moise et al. | |
| 2004/0150923 A1 * | 8/2004 | Egger et al. | 361/15 |
| 2004/0164050 A1 * | 8/2004 | Egger et al. | 216/58 |

FOREIGN PATENT DOCUMENTS

EP 0795896 9/1997

OTHER PUBLICATIONS

International Search Report, mailing date Dec. 01, 2004.

* cited by examiner

*Primary Examiner*—Jack Chen
(74) *Attorney, Agent, or Firm*—Lerner, David, Littenberg, Krumholz & Mentlik, LLP

(57) ABSTRACT

An Iridium barrier layer is between a contact plug and a bottom electrode of a capacitor. Etching is performed to pattern the bottom electrode and barrier layer using a fluorine-based recipe resulting in the formation of a first fence clinging to the sidewalls. Next the remaining barrier layer is etched using a CO-based recipe. A second fence is formed clinging to and structurally supported by the first fence. At the same time, the CO-based recipe etches away a substantial portion of the first fence to remove the structural support provided to the second fence. The second fence is therefore lifted-off from the sidewalls leaving the sidewalls substantially free of clinging fences. The etched barrier layer has a sidewall transition. The sidewalls have a relatively low taper angle above the sidewall transition and a relatively steep taper angle below the sidewall transition.

9 Claims, 6 Drawing Sheets

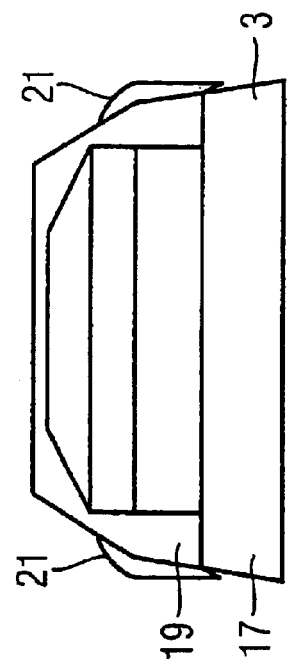
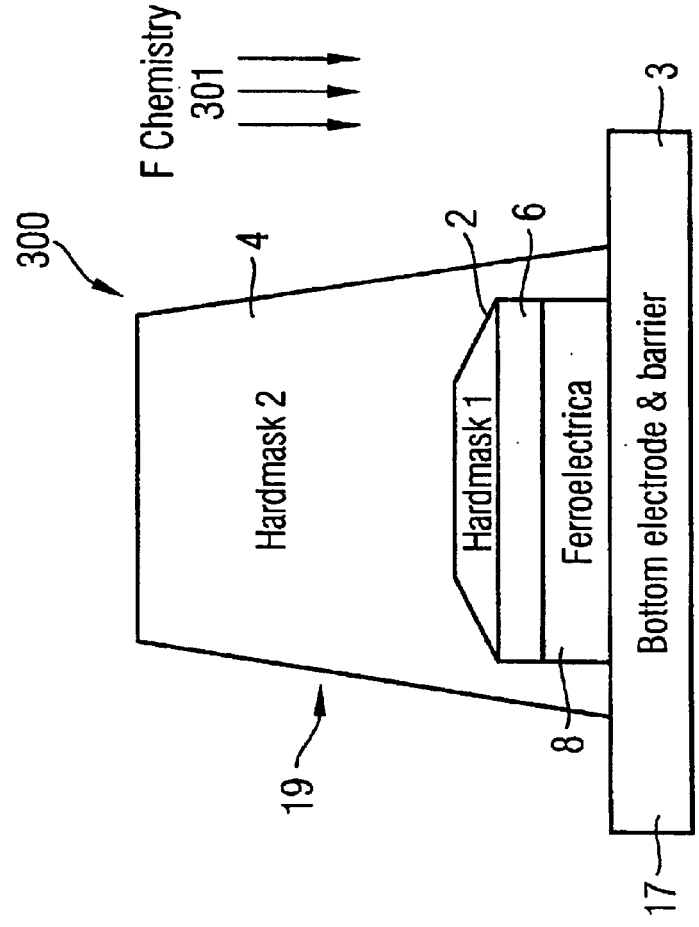

FENCE-FREE ETCHING OF IRIDIUM BARRIER HAVING A STEEP TAPER ANGLE

FIELD OF THE INVENTION

The present invention relates to processes for etching barrier layers used in ferroelectric devices. More particularly, the present invention relates to a process for the fence-free etching of the bottom electrode barrier layer in a ferroelectric capacitor on plug structure.

BACKGROUND OF THE INVENTION

In prior-art wafers, poly silicon or tungsten plugs (contact plugs) are often used as vertical interconnects between metal lines in multilevel interconnect schemes. In ferroelectric capacitors such contact plugs form a capacitor on plug (COP) structure. The ferroelectric materials in FeRAM (Ferroelectric Random Access Memory) and high K materials in DRAM generally are crystallized at a high temperature (600C or above) in oxygen ambient. A thick barrier against oxygen diffusion is needed to prevent the diffusion of oxygen from a ferroelectric capacitor to the contact plug.

An Ir (Iridium) based barrier is a good material to efficiently block this oxygen diffusion. A typical hardmask used during the etching of this Ir barrier is made from TEOS (Tetraethyl Orthosilicate). Due to the low etching selectivity between Ir and TEOS, the thickness of the barrier is limited by the maximum usable hard mask thickness and the TEOS hard mask needs to be very thick compared to the capacitor stack, resulting in a steep side wall angle prior to etching.

FIGS. 1–3 show conventional hardmask etching steps for ferroelectric capacitors.

FIG. 1 shows a wafer 1 following prior art processing steps. Following deposition of a ferroelectric stack, a top electrode (TE) 6 is covered with a TEOS hardmask 2 which was formed using mask resist strip patterning. The patterning of the top electrode 6 is performed using halogen or CO-based recipe to etch materials such as Iridium, Platinum, Iridium Oxide or various conductive oxide films. A portion of an underlying ferroelectric layer 8 (for example, PZT, SBT, or BLT) might also be etched during this step. A ferroelectric (FE) capacitor 5 is formed from portions including the top electrode 6, ferroelectric layer 8 and a bottom electrode (BE) 3 as shown in the magnified view in the figure.

A Ti or TiN glue-layer 7 serves to adhere the bottom electrode 3 to the substructure of the FE capacitor 5. The substructure includes a top TEOS layer 15 covering a top nitride layer 9. Between the Ti glue-layer 7 and the bottom electrode 3 can be a barrier layer 17 including materials such as Ir (Iridium), $IrO_2$ (Iridium Oxide) or other materials for blocking oxygen diffusion from the ferroelectric layer 8 to a poly silicon contact plug 13. The poly silicon contact plug 13 passes through the wafer 1 to form an electrical connection between an active region and the bottom electrode 3.

Another TEOS hardmask 4 is deposited in preparation for a second etching step which patterns the bottom electrode 3. During the second etching step, the ferroelectric layer 8 may be further etched along with the bottom electrode 3. There is a slight over-etch through the top TEOS layer 15 along with any intermediate materials such as the layers of Ir (Iridium) and $IrO_2$ (Iridium Oxide). FIG. 2 shows the wafer 1 following this conventional patterning of the bottom electrode 3.

FIG. 3(a) shows a capacitor cell 300 with the thick hardmask 4 having steeply angled sidewalls 19 which is required due to the low selectivity between the Ir of the barrier layer 17 and the TEOS of the hardmask 4. It is desirable to have a thick Ir layer for blocking oxygen diffusion from the ferroelectric layer 8 to the poly silicon contact plug 13, but this is not easily done because it requires a very thick hardmask 4 with the resulting steeply angled sidewalls 19.

FIG. 3(b) shows the wafer of FIG. 3(a) after sputtered controlled etching of the bottom electrode 3 and barrier 17 while using the hardmask 4 for patterning the bottom electrode 3. Due to the steeply angled hardmask sidewalls 19, residues of the etching process or fences 21 remain clinging to the hardmask sidewalls 19. These fences 21 are composed of compounds from the etched materials, such as Ir. They have low density and are unstable. During the anneals, they exhibit volume changes and they show poor adhesion to the side walls. These fences 21 are particularly detrimental to the following encapsulation processes.

It would be desirable to etch the Ir barrier 17 without the resulting fences 21, but Ir is a noble metal with extremely few volatile compounds for use with plasma etching. To improve the volatility, high temperature etching with a fluorine-based recipe can be employed, but formation of the Ir fences 21 can still not be completely suppressed during this etching. To remove these Ir fences 21 with the high-temperature fluorine etching, a considerable over-etch is necessary. During this over-etch, the underlying layers such as the glue-layer 7 are attacked. The over-etch can also result in capacitor damage.

CO-based chemistries, for example, can be used to etch the Ir barrier 17 resulting in a steep taper angle of the sidewall of the barrier 17 and good hardmask selectivity to allow thicker barrier layers. However, when the barrier 17 is etched to have a steep taper angle, thin Ir fences 21 form on the sidewalls of the TEOS hardmask. Moreover, steep capacitor cells are often desirable and thus the TEOS hardmask will have the steep sidewalls 19. Unfortunately, sputtering does not work well for removing the Ir fences 21 from steep TEOS hardmask sidewalls 19. In order to be able to effectively remove the Ir fences 21 by a physical sputtering mechanism from the sidewalls 19 of the TEOS hardmask, the TEOS hardmask would need a low tapered sidewall angled in the range of 60 degrees or less. It is often desirable to taper the sidewalls 19 of the TEOS hardmask at an angle steeper than 80 degrees and thus a physical sputtering mechanism will not work well for removing the Ir fences 21.

It would be desirable to have a fence-free process for etching a barrier layer of a ferroelectric device. In particular, it would be desirable to etch a steeply tapered barrier layer covered by a steeply angled hardmask without ending up with fences clinging to the sidewalls of the hardmask and barrier layer.

SUMMARY OF THE INVENTION

A ferroelectric capacitor has a COP structure. An iridium barrier layer is between a contact plug and a bottom electrode of the capacitor. The barrier is etched to have a steep taper while still producing a fence-free capacitor. In order to remove the fences, etching is performed to pattern the bottom electrode and barrier layer using a fluorine-based recipe resulting in the formation of a first fence clinging to sidewalls of a steep TEOS hardmask cover, the bottom electrode and the barrier layer. Next the remaining barrier layer is again etched using a CO-based recipe. A second fence is formed clinging to and structurally supported by the first fence. At the same time, the CO-based recipe etches away a substantial portion of the first fence to remove the structural support provided to the second fence. The second fence is therefore lifted-off from the sidewalls leaving the sidewalls substantially free of clinging fences. The process results in substantially fence-free sidewalls. The etched barrier layer has a sidewall transition. As a result of the etch using the fluorine-based recipe, the barrier layer has a relatively low taper angle of the sidewalls above the sidewall transition. As a result of the etch using the CO-based recipe, the barrier layer has a relatively steep taper angle below the sidewall transition.

BRIEF DESCRIPTION OF THE FIGURES

Further preferred features of the invention will now be described for the sake of example only with reference to the following figures, in which:

FIG. 3(a) shows a prior-art capacitor cell ready for etching of a bottom electrode and barrier.

FIG. 3(b) shows the capacitor cell of FIG. 3(a) after sputtered controlled etching of the bottom electrode and barrier and further illustrates fences clinging to the sidewalls of the hardmask.

DETAILED DESCRIPTION OF THE EMBODIMENTS

Figure 7:
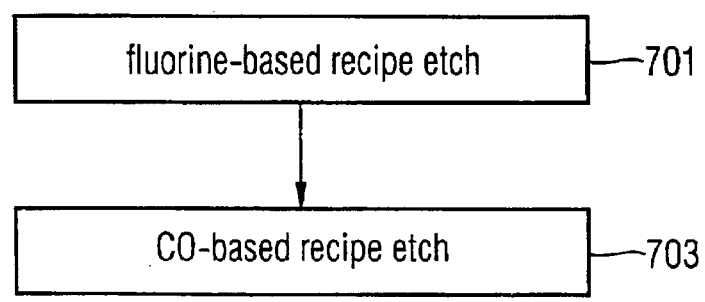
FIG. 7 shows the processing steps of the present invention.

The present invention uses a two step etching process to etch the Ir barrier layer 17 of the capacitor cell 300 of FIG. 3A. FIG. 7 illustrates the steps of the method of the present invention. The method involves two general steps. At a step 701 a fluorine-based recipe (CF4, SF6) 301 plasma etching process is used to partially etch the Ir barrier layer 17 (see FIG. 3A). At a step 703 a further plasma etching step is performed using a CO-based etching recipe 403 (see FIGS. 4 and 5). The CO-based etching recipe can be CO, $Cl_2$, $N_2$, $O_2$ or $CO_1NH_3$, for example.

Figure 1:
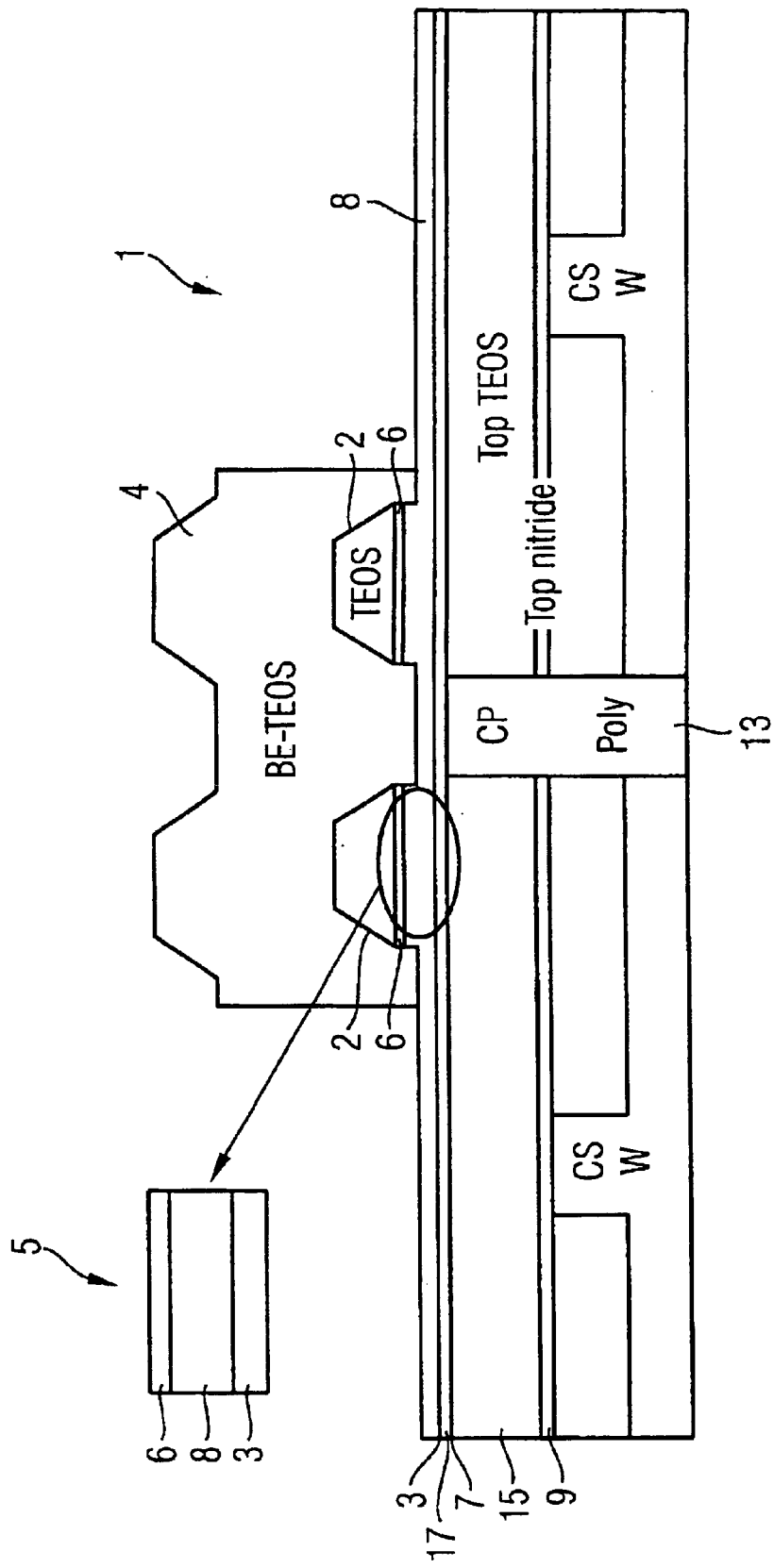
FIG. 1 shows a wafer 1 following prior art processing steps.
Figure 2:
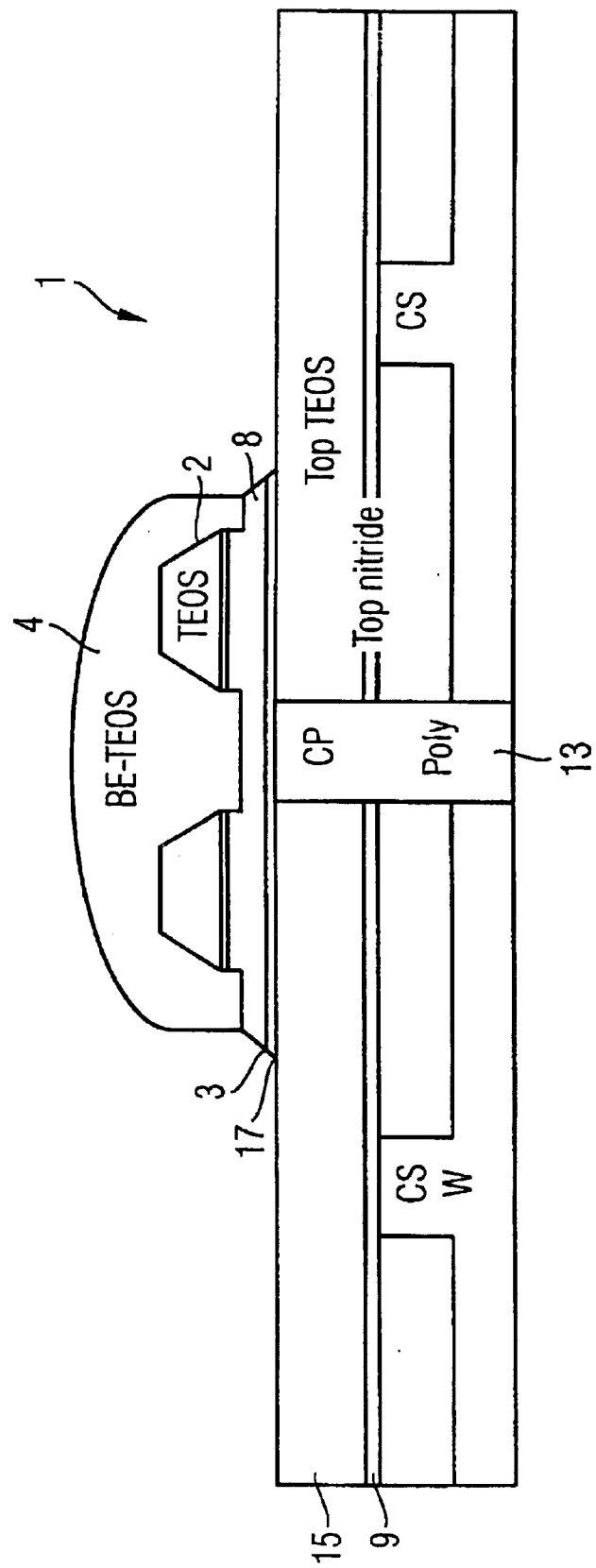
FIG. 2 shows the wafer 1 following conventional patterning of the bottom electrode and barrier.
Figure 4:
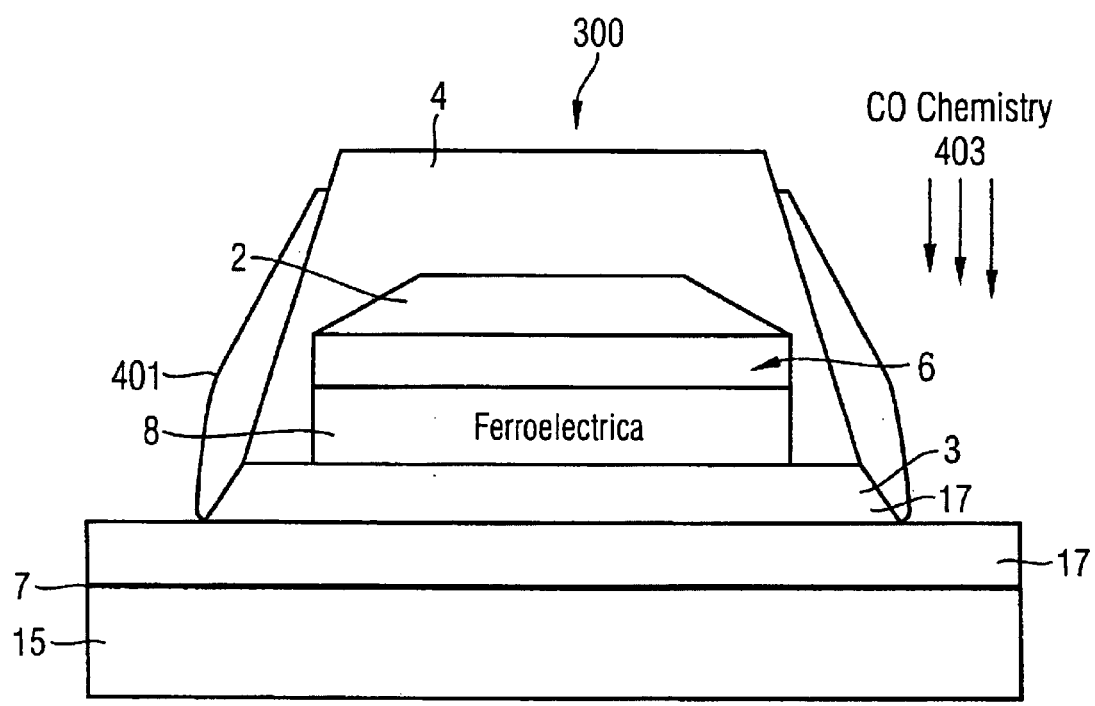
FIG. 4 shows the capacitor cell of FIG. 3(a) following a first etching step of the present invention in which the barrier is partially etched end a thick first fence is formed.

FIG. 4 shows the capacitor cell 300 following the etching step 701. Typically, about 30% to 90% of the total Ir barrier 17 thickness is removed. During this step thick first fences 401 form. The Ir barrier layer 17 is tapered under the first fence 401, because the fence acts like a gradually widening hardmask. The first fence 401 is rich in Ir, but has a relatively porous structure, and can therefore be removed by a process such as wet chemistry.

Figure 5:
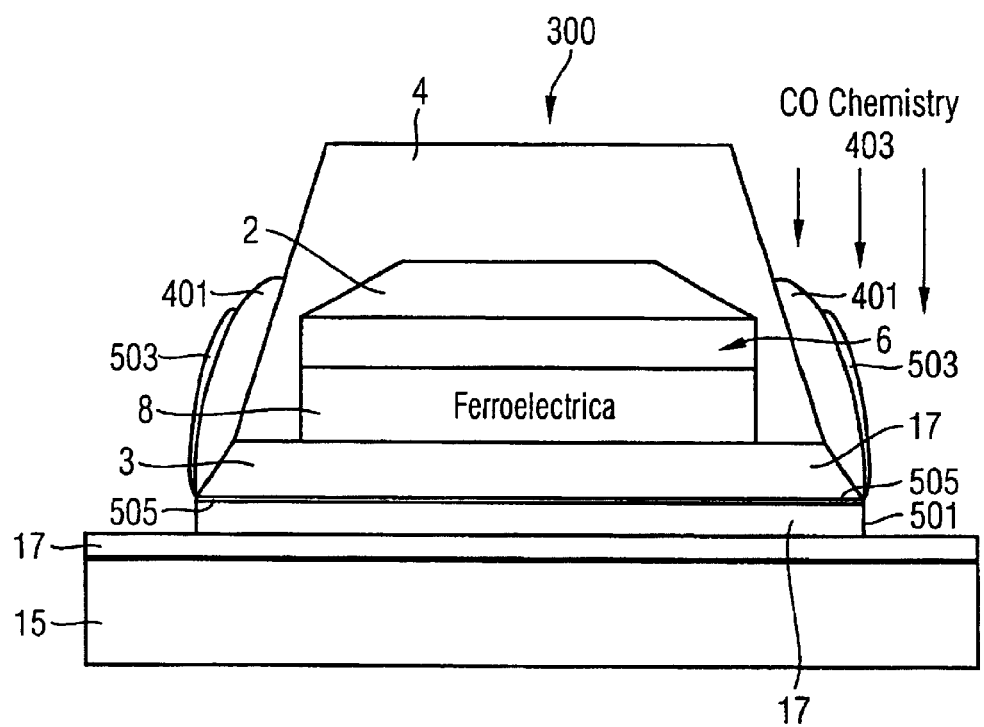
FIG. 5 shows the capacitor cell of FIG. 4 during a second etching step during which the remainder of the barrier is etched and a second fence is formed as the first fence is etched.

FIG. 5 shows the capacitor cell 300 during plasma etching using the CO-based etching recipe 403 of the step 703. The remaining Ir barrier layer 17 is etched to form an almost vertical taper angle 501, thereby forming a sidewall transition 505. The barrier layer 17 changes from a relatively low taper angle above the sidewall transition 505 to a steep, almost vertical, taper angle below the sidewall transition 505. During the etching of step 703, because the barrier layer 17 is etched to have a steep taper angle, thin second fences 503, like the fences 21 of FIG. 3B, form on top of the already existing fences 401. The second fences 503 have a much more compact structure than the fences 401 and cannot be easily removed by wet chemistry.

However, the present invention takes advantage of the second fences 503 being supported by the first fences 401 to remove the second fence 503 while still allowing a steep taper angle of the barrier layer 17. The CO-based etching recipe 403 etches the TEOS hardmask 4 at a low etch rate. Therefore it can be applied to the capacitor cell 300 for a relatively long amount of time. As the CO-based etching recipe 403 etches away the barrier layer 17 and forms the second fences 503, it also etches away the relatively porous first fences 401. Because the second fences 503 are supported by the underlying first fence 401, as the first fence 401 is removed, the fences 503 are also cut off from the sidewalls by a lift-off process. Thus, even though the CO-based etching recipe 403 can not etch away the second fences 503 directly, it can etch away the first fences 401 formed by the fluorine-based recipe 301 of the step 701 to thereby remove the second fences 503.

Figure 6:
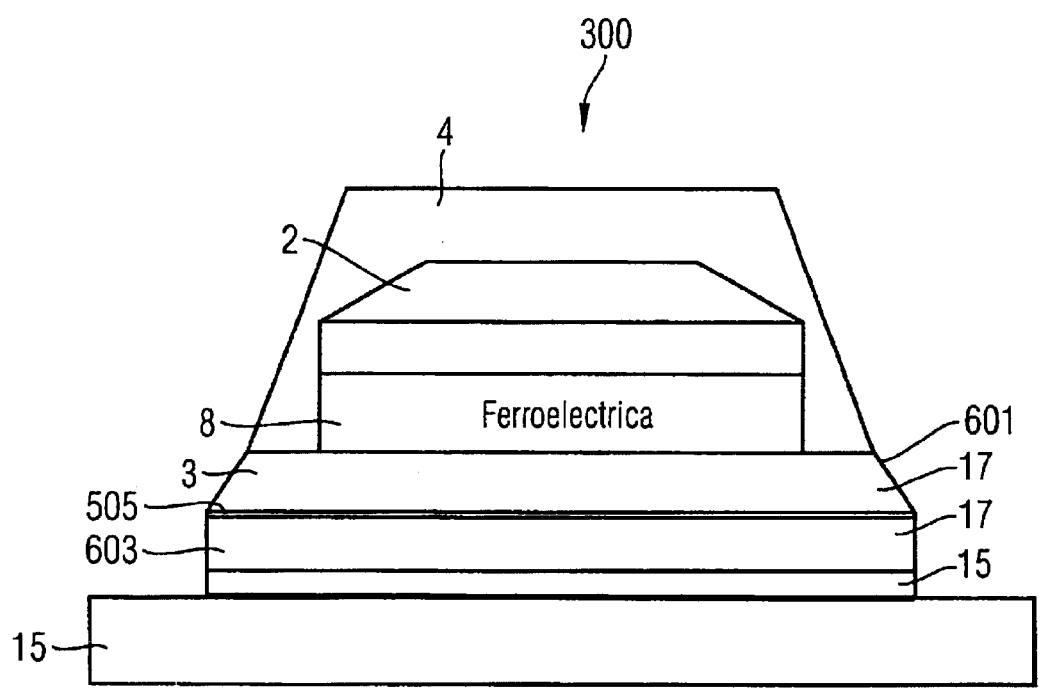
FIG. 6 shows the capacitor cell of FIG. 4 after the second etching step having substantially no fences and having a barrier etched with a steep taper angle.

FIG. 6 shows the capacitor cell 300 following the etching step 703. The fences 401, 503 are removed. The sidewall of the barrier layer includes an upper area with a lower taper angle 601 (from using the a fluorine-based recipe 301) and an upper area with a steeper taper angle 603 (from using the CO-based etching recipe 403). Therefore the barrier layer 17 is etched to have a steep average taper angle. The capacitor cell 300 can be over-etched into the top TEOS layer 15 using the method of the present invention. The advantages of the CO-based recipe 403 (steep taper angle, good uniformity and high selectivity) are therefore combined with the advantages of the fluorine-based recipe 301 (high etch rate). Time is saved by the present invention because the fast fluorine-based recipe 301 is combined with a relatively slow CO-based recipe.

Other materials can be used for either the barrier layer 17 or the hardmask 4 (for example, the hardmask can be $Al_2O_3$, TiN or TiAlN used with barriers formed from Ir or $IrO_2$) so long as an etching process can be used to etch a first underlying fence while a second overlying fence is formed.

Still other materials and method steps can be added or substituted for those above. Thus, although the invention has been described above using particular embodiments, many variations are possible within the scope of the claims, as will be clear to a skilled reader.

We claim:

1. A method for manufacturing a ferroelectric capacitor comprising the steps of:

forming a substructure of the capacitor having a contact plug passing therethrough for electrically connecting a bottom electrode of the capacitor to an underlying active layer;

depositing over the substructure the bottom electrode including a barrier layer intermediate therebetween;

depositing over the bottom electrode a ferroeletric layer such that the diffusion of contaminants from the ferroelectric layer to the contact plug is inhibited by the intermediate barrier layer;

depositing over the ferroelectric layer a top electrode;

depositing over the top electrode, the underlying ferroelectric layer and the bottom electrode a first hardmask;

etching to pattern the top electrode using the first hardmask;

depositing over the remaining portions of the first hardmask and on the bottom electrode an additional hardmask;

etching to pattern the bottom electrode using a first recipe resulting in the formation of a first fence clinging to sidewalls of the additional hardmask, bottom electrode and barrier layer; and etching the intermediate barrier layer using a second recipe resulting in the formation of a second fence clinging to and structurally supported by the first fence while at the same time etching away a substantial portion of the first fence to remove the structural support provided to the second fence so that the second fence is lifted-off from the sidewalls leaving the sidewalls substantially free of clinging fences.

2. The method of claim 1 wherein the intermediate barrier layer has a composition including Iridium.

3. The method of claim 2, wherein 30% to 90% of the barrier layer not protected by the additional hardmask is removed during the etching using the first recipe.

4. The method of claim 1, wherein the etching of the intermediate barrier layer using the second recipe continues until portions of the substructure are also etched.

5. The method of claim 1, wherein the additional hardmask is tapered at an angle steeper than 60 degrees.

6. The method of claim 1, wherein the contaminants include oxygen.

7. The method of claim 1, wherein the first recipe is a fluorine-based recipe.

8. The method of claim 1, wherein the second recipe is a CO-based recipe.

9. The method of claim 1, wherein the additional hardmask is formed from TEOS.

* * * * *

UNITED STATES PATENT AND TRADEMARK OFFICE
CERTIFICATE OF CORRECTION

PATENT NO. : 7,015,049 B2  
APPLICATION NO. : 10/654376  
DATED : March 21, 2006  
INVENTOR(S) : Ulrich Egger et al.

It is certified that error appears in the above-identified patent and that said Letters Patent is hereby corrected as shown below:

On the cover page of the patent in item (75), "Munich (DE)", should read --Hopewell Junction, NY--.

Column 1, lines 28 and 29, "hard mask" should read -- hardmask--.
Column 3, line 30, "end" should read --and--.
Column 3, line 53, "after the words "can be" insert --a mixture of --.
Column 3, line 53, "$N_2$," should read --$N_2$ and--.
Column 3, line 54, delete "," and insert --and--.
Column 3, line 54, "$CO_1NH_3$" should read --CO and $NH_3$--.

Signed and Sealed this

Fifth Day of September, 2006

JON W. DUDAS  
*Director of the United States Patent and Trademark Office*